US010192836B2

(12) United States Patent
Saito

(10) Patent No.: US 10,192,836 B2
(45) Date of Patent: Jan. 29, 2019

(54) SEMICONDUCTOR DEVICE

(71) Applicant: PEZY COMPUTING K.K., Tokyo (JP)

(72) Inventor: Motoaki Saito, Tokyo (JP)

(73) Assignee: PEZY COMPUTING K.K., Tokyo (JP)

( * ) Notice: Subject to any disclaimer, the term of this patent is extended or adjusted under 35 U.S.C. 154(b) by 0 days.

(21) Appl. No.: 15/549,589

(22) PCT Filed: Mar. 30, 2015

(86) PCT No.: PCT/JP2015/059999
§ 371 (c)(1),
(2) Date: Aug. 8, 2017

(87) PCT Pub. No.: WO2016/157387
PCT Pub. Date: Oct. 6, 2016

(65) Prior Publication Data
US 2018/0033743 A1  Feb. 1, 2018

(51) Int. Cl.
*H01L 23/64* (2006.01)
*H01L 21/822* (2006.01)
(Continued)

(52) U.S. Cl.
CPC ........... *H01L 23/645* (2013.01); *H01F 5/003* (2013.01); *H01F 38/14* (2013.01); *H01L 21/822* (2013.01);
(Continued)

(58) Field of Classification Search
CPC ............. H01L 23/5386; H01L 25/0652; H01L 25/0655; H01L 25/0657; H01L 25/07; H01L 25/071; H01L 25/074
See application file for complete search history.

(56) References Cited

U.S. PATENT DOCUMENTS 7,714,409 B2   5/2010 Nakashiba
8,125,059 B2   2/2012 Ito et al.
(Continued)

FOREIGN PATENT DOCUMENTS

JP   2007-318003 A   12/2007
JP   2010-103611 A   5/2010
(Continued)

OTHER PUBLICATIONS

European Search Report dated Mar. 8, 2018 in EP15887540.1, 10 pages.

*Primary Examiner* — Moazzam Hossain
*Assistant Examiner* — Stanetta Isaac
(74) *Attorney, Agent, or Firm* — Muncy, Geissler, Olds & Lowe, P.C.

(57) ABSTRACT

A semiconductor device equipped with a base board, a first element, a second element, and an interposer board, wherein: the first element is positioned on the base board; a signal transmitting/receiving terminal of the first element and a plurality of base board terminals contact one another; the second element is positioned on the base board; a signal transmitting/receiving terminal of the second element and the plurality of base board terminals contact one another; the interposer board is positioned so as to extend on the first element and the second element; a first contactless signal transmitting/receiving unit of the interposer board is capable of contactlessly transmitting and receiving a signal; and a second contactless signal transmitting/receiving unit of the interposer board is capable of contactlessly transmitting and receiving a signal.

2 Claims, 4 Drawing Sheets

(51) Int. Cl.
  *H01L 25/065* (2006.01)
  *H01L 25/07* (2006.01)
  *H01L 25/18* (2006.01)
  *H01L 27/04* (2006.01)
  *H04B 5/02* (2006.01)
  *H01F 5/00* (2006.01)
  *H01F 38/14* (2006.01)
  *H01L 23/498* (2006.01)
  *H01L 23/538* (2006.01)
  *H01L 23/00* (2006.01)
  *H01L 23/522* (2006.01)
  *H01L 23/14* (2006.01)

(52) U.S. Cl.
  CPC .... *H01L 23/49838* (2013.01); *H01L 23/5227* (2013.01); *H01L 23/5381* (2013.01); *H01L 23/5385* (2013.01); *H01L 24/16* (2013.01); *H01L 25/065* (2013.01); *H01L 25/0655* (2013.01); *H01L 25/07* (2013.01); *H01L 25/18* (2013.01); *H01L 27/04* (2013.01); *H04B 5/02* (2013.01); *H01L 23/147* (2013.01); *H01L 23/49816* (2013.01); *H01L 2224/16227* (2013.01); *H01L 2924/15192* (2013.01); *H01L 2924/15313* (2013.01)

(56) References Cited

U.S. PATENT DOCUMENTS

| | | | |
|---|---|---|---|
| 8,310,025 | B2 | 11/2012 | Nakashiba |
| 8,704,609 | B2 | 4/2014 | Kuroda |
| 2007/0273015 | A1 | 11/2007 | Nakashiba |
| 2010/0109133 | A1 | 5/2010 | Ito et al. |
| 2010/0264515 | A1 | 10/2010 | Nakashiba |
| 2010/0265024 | A1 | 10/2010 | Nakashiba |
| 2011/0260786 | A1 | 10/2011 | Kuroda |
| 2014/0254092 | A1 | 9/2014 | Im et al. |
| 2015/0207541 | A1 | 7/2015 | Kuroda |

FOREIGN PATENT DOCUMENTS

| | | |
|---|---|---|
| JP | 2010-109112 A | 5/2010 |
| JP | 2010-251663 A | 11/2010 |
| JP | 2011-187823 A | 9/2011 |
| JP | 2014-033432 A | 2/2014 |

SEMICONDUCTOR DEVICE

TECHNICAL FIELD

The present invention relates to a semiconductor device that includes an interposer board having a contactless signal transmitting/receiving unit.

BACKGROUND ART

Conventionally, a semiconductor device that includes a silicon interposer 60 provided with inductors 304 and 324 functioning as a contactless signal transmitting/receiving unit is known (refer to FIG. 4 of Patent Document 1). In the semiconductor device of Patent Document 1, two elements (a semiconductor chip 10 and a semiconductor chip 20) transmit and receive a signal via the silicon interposer 60. The silicon interposer 60 is disposed on surfaces provided with wiring lines or terminals in the two elements 10 and 20.

In addition, a semiconductor device that includes a third module 90 provided with couplers 92 and 93 functioning as a contactless signal transmitting/receiving unit is known (FIGS. 22 and 23 of Patent Document 2). In the semiconductor device of Patent Document 2, two elements (a first module 70 and a second module 80) transmit and receive a signal via the third module 90. The third module 90 is electrically connected to the first module 70 via a bonding wire 79 and is electrically connected to the second module 80 via a bonding wire 89.

Patent Document 1: Japanese Unexamined Patent Application, Publication No. 2010-251663
Patent Document 2: Japanese Unexamined Patent Application, Publication No. 2014-33432

DISCLOSURE OF THE INVENTION

Problems to be Solved by the Invention

However, the semiconductor device preferably has a configuration in which miniaturization is easy. In addition, the semiconductor device preferably has a configuration in which manufacturing is easy.

In the semiconductor device of Patent Document 1, the silicon interposer 60 is disposed on the surfaces provided with the wiring lines or the terminals in the two elements (the semiconductor chip 10 and the semiconductor chip 20). As a mechanism for miniaturizing the semiconductor device of Patent Document 1, a mechanism for reducing widths of a formation region of a contactless transmitting/receiving unit 302 of the semiconductor chip 10 and a formation region of a contactless transmitting/receiving unit 322 of the semiconductor chip 20 is considered. When this mechanism is adopted, it is necessary to reduce a width of the silicon interposer 60 according to the reduced widths of the regions.

However, even if the width of the silicon interposer 60 is reduced, a width of the depth direction is not changed. For this reason, an aspect ratio of the silicon interposer 60 increases. That is, the silicon interposer 60 has an elongated shape (for example, a shape in which an aspect ratio becomes 10 to 100). The silicon interposer 60 having the elongated shape is more likely to have a low yield. In addition, it is more likely to become hard to handle the silicon interposer 60 having an elongated shape. For this reason, it cannot be said that miniaturization is enabled and manufacturing is easy in the configuration of the semiconductor device of Patent Document 1.

In the semiconductor device of Patent Document 2, the interposer 90 (third module 90) is provided with the contactless signal transmitting/receiving units 92 and 93 and is provided with terminals corresponding to the bonding wires 79 and 89. Therefore, the interposer 90 (third module 90) tends to have a complicated structure. In addition, when the first module 70, the second module 80, and the interposer 90 (third module 90) are assembled, the alignment of the contactless signal transmitting/receiving units 92 and 93 and the alignment of the terminals corresponding to the bonding wires 79 and 89 are performed at the same time. For this reason, when the first module 70, the second module 80, and the interposer 90 (third module 90) are assembled, high-precision alignment is required. Therefore, it cannot be said that miniaturization and manufacturing are easy in the configuration of the semiconductor device of Patent Document 2.

An object of the present invention is to provide a semiconductor device that is provided with an interposer board having a contactless signal transmitting/receiving unit and has a configuration in which miniaturization and manufacturing are easy.

Means for Solving the Problems

The present invention relates to a semiconductor device. The semiconductor device includes a base board that has a base board terminal surface provided with a plurality of base board terminals; a first element that has a first element board having a first element-first principal surface and a first element-second principal surface that is a surface opposite to the first element-first principal surface, a first element signal transmitting/receiving terminal provided on the first element-first principal surface of the first element board, and a first element contactless signal transmitting/receiving unit provided on the first element-first principal surface of the first element board; a second element that has a second element board having a second element-first principal surface and a second element-second principal surface that is a surface opposite to the second element-first principal surface, a second element signal transmitting/receiving terminal provided on the second element-first principal surface of the second element board, and a second element contactless signal transmitting/receiving unit provided on the second element-first principal surface of the second element board; and an interposer board with an interposer board-first principal surface that has an interposer board-first contactless signal transmitting/receiving unit provided on the interposer board-first principal surface and an interposer board-second contactless signal transmitting/receiving unit provided on the interposer board-first principal surface and electrically connected to the interposer board-first contactless signal transmitting/receiving unit. The first element is disposed on the base board such that the first element-first principal surface faces the base board terminal surface and the first element signal transmitting/receiving terminal and one of the plurality of base board terminals are in contact with each other and are capable of transmitting and receiving a signal. The second element is disposed on the base board such that the second element-first principal surface faces the base board terminal surface and the second element signal transmitting/receiving terminal and one of the plurality of base board terminals are in contact with each other and are capable of transmitting and receiving a signal. The interposer board is disposed to extend on the first element and the second element such that the interposer board-first principal surface faces the first element-second principal surface and the second element-second principal surface, the interposer board-first contactless signal transmitting/receiving unit is capable of contactlessly transmitting and receiving a signal to and from the first element contactless signal transmitting/receiving unit via the first element board, and the interposer board-second contactless signal transmitting/receiving unit is capable of contactlessly transmitting and receiving a signal to and from the second element contactless signal transmitting/receiving unit via the second element board.

In addition, the first element-second principal surface may have a first element-second principal surface terminal facing region that is a surface opposite to a region provided with the first element signal transmitting/receiving terminal in the first element-first principal surface and a first element-second principal surface contactless signal transmitting/receiving unit facing region that is a surface opposite to a region provided with the first element contactless signal transmitting/receiving unit in the first element-first principal surface. The second element-second principal surface may have a second element-second principal surface terminal facing region that is a surface opposite to a region provided with the second element signal transmitting/receiving terminal in the second element-first principal surface and a second element-second principal surface contactless signal transmitting/receiving unit facing region that is a surface opposite to a region provided with the second element contactless signal transmitting/receiving unit in the second element-first principal surface. The interposer board-first principal surface of the interposer board may face the first element-second principal surface contactless signal transmitting/receiving unit facing region and the second element-second principal surface contactless signal transmitting/receiving unit facing region and may face at least one of a part of the first element-second principal surface terminal facing region and a part of the second element-second principal surface terminal facing region.

In addition, the first element board, the second element board, and the interposer board may be formed of a semiconductor material, the interposer board-first principal surface of the interposer board may have an exposure portion to which the semiconductor material is exposed, and the exposure portion may be in contact with at least one of the part of the first element-second principal surface terminal facing region and the part of the second element-second principal surface terminal facing region.

In addition, the first element contactless signal transmitting/receiving unit, the second element contactless signal transmitting/receiving unit, the interposer board-first contactless signal transmitting/receiving unit, and the interposer board-second contactless signal transmitting/receiving unit may be coils that are formed of wiring lines.

Effects of the Invention

According to the present invention, a semiconductor device that includes an interposer board having a contactless signal transmitting/receiving unit and has a configuration in which miniaturization and manufacturing are easy can be provided.

BRIEF DESCRIPTION OF THE DRAWINGS

FIGS. 1A and 1B are diagrams illustrating a semiconductor device 1 according to a first embodiment of the present invention, in which FIG. 1A is a plan view, and FIG. 1B is a cross-sectional view taken along the line A-A.

FIG. 2A is a plan view when the first element 20 is viewed from a first element-first principal surface 22, FIG. 2B is a plan view when the second element 30 is viewed from a second element-first principal surface 32, and FIG. 2C is a plan view when the interposer board 40 is viewed from an interposer board-first principal surface.

FIGS. 3A and 3B are diagrams illustrating a semiconductor device 1A according to a second embodiment of the present invention, in which FIG. 3A is a cross-sectional view of the semiconductor device 1A according to the second embodiment, and FIG. 3B is a plan view when an interposer board 40 is viewed from an interposer board-first principal surface.

FIGS. 4A to 4C are diagrams illustrating variations of an arrangement of an interposer board, in which FIG. 4A is a diagram illustrating the case in which the interposer board is applied to three elements, FIG. 4B is a diagram illustrating the case in which the interposer board is applied to four elements, and FIG. 4C is a diagram illustrating the case in which the interposer board is applied to five elements.

PREFERRED MODE FOR CARRYING OUT THE INVENTION

[First Embodiment]

Figure 1A:
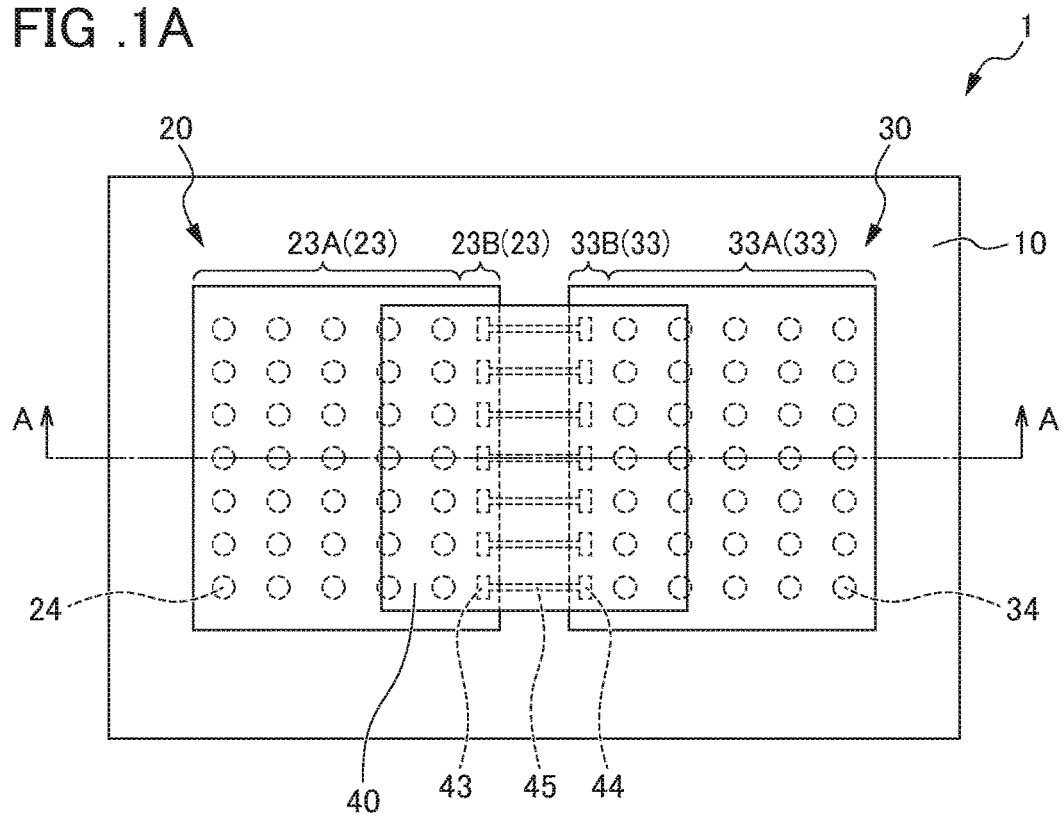
Figure 1B:
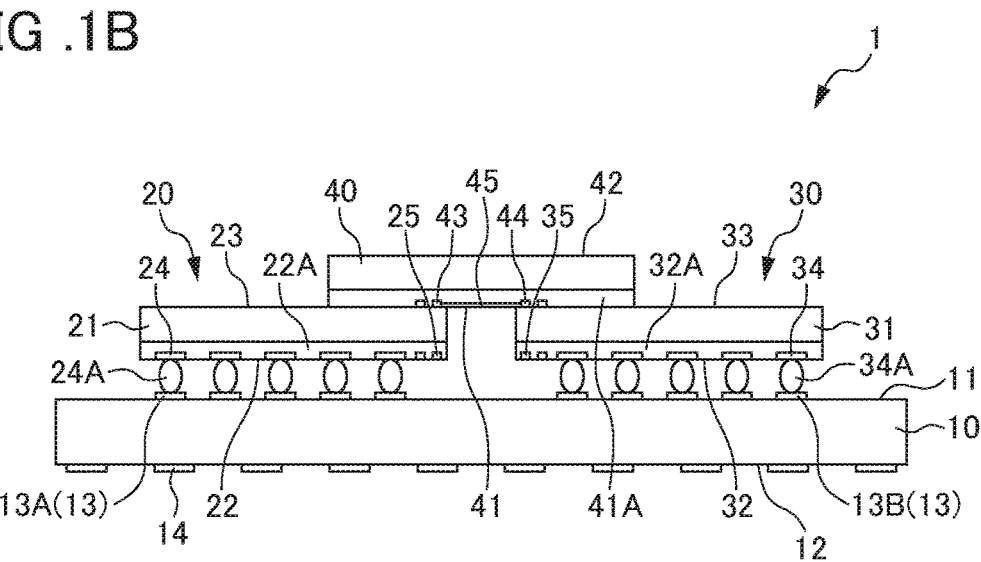
Figure 2A:
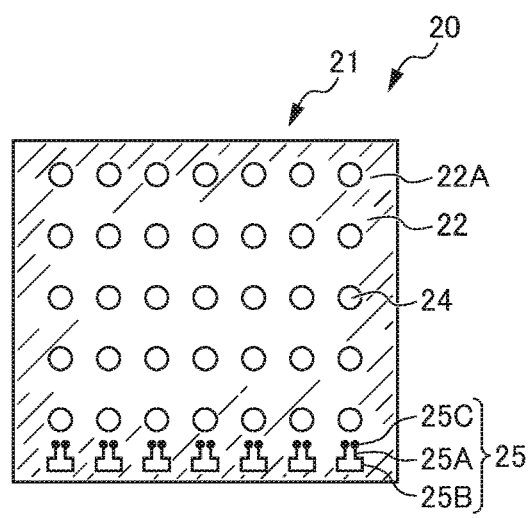
FIGS. 2A to 2C are diagrams illustrating a first element 20, a second element 30, and an interposer board 40.
Figure 2B:
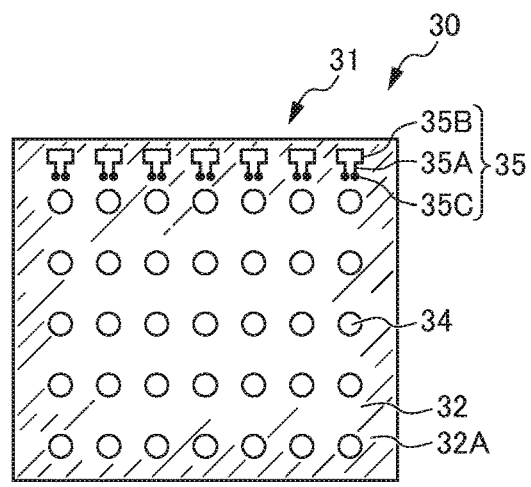
Figure 2C:
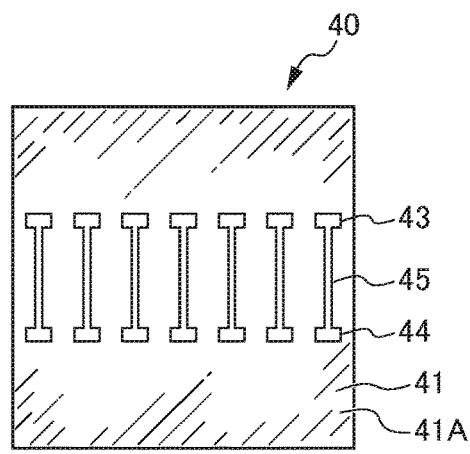

Hereinafter, a first embodiment of the present invention will be described with reference to the drawings. FIGS. 1A and 1B are diagrams illustrating a semiconductor device 1 according to the first embodiment of the present invention, in which FIG. 1A is a plan view, and FIG. 1B is a cross-sectional view taken along the line A-A. FIGS. 2A to 2C are diagrams illustrating a first element 20, a second element 30, and an interposer board 40, in which FIG. 2A is a plan view when the first element 20 is viewed from a first element-first principal surface 22, FIG. 2B is a plan view when the second element 30 is viewed from a second element-first principal surface 32, and FIG. 2C is a plan view when the interposer board 40 is viewed from an interposer board-first principal surface 41.

In the following description, "transmitting and receiving a signal contactlessly" means that one transmitting/receiving unit transmitting and receiving the signal and the other transmitting/receiving unit transmitting and receiving the signal do not come into contact with each other and transmit and receive the signal without using a conductive member (at least one of a solder, a conductive adhesive, and a wire). In addition, "transmitting and receiving a signal contactually" means that one transmitting/receiving unit transmitting and receiving the signal and the other transmitting/receiving unit transmitting and receiving the signal come into contact with each other and transmit and receive the signal or transmit and receive the signal using a conductive member (at least one of a solder, a conductive adhesive, and a wire).

As illustrated in FIGS. 1A and 2B, the semiconductor device 1 includes a base board 10, the first element 20, the second element 30, and the interposer board 40.

The base board 10 has a base board internal terminal surface 11 and a base board external terminal surface 12 functioning as base board terminal surfaces and a plurality of base board internal terminals 13 and a plurality of base board external terminals 14 functioning as a plurality of base board terminals. The base board 10 is a printed wiring board. The base board internal terminal surface 11 is a principal surface of an upper side of the base board 10. The base board external terminal surface 12 is a surface opposite to the base board internal terminal surface 11 and is a principal surface of a lower side of the base board 10.

As illustrated in FIG. 1B, the plurality of base board internal terminals 13 are provided on the base board internal terminal surface 11. The plurality of base board internal terminals 13 are configured using a plurality of first element side base board internal terminals 13A electrically connected to a first element signal transmitting/receiving terminal 24 (to be described later) of the first element 20 and a plurality of second element side base board internal terminals 13B electrically connected to a second element signal transmitting/receiving terminal 34 (to be described later) of the second element 30.

The plurality of base board external terminals 14 are provided on the base board external terminal surface 12. The plurality of base board internal terminals 13 and the plurality of base board external terminals 14 are electrically connected via internal wiring lines (not illustrated in the drawings) or via holes (not illustrated in the drawings) provided in the base board 10. Each of the base board external terminals 14 is electrically connected to a terminal of a circuit board (not illustrated in the drawings) provided in an electrical apparatus or the like. The semiconductor device 1 is electrically connected to the terminal of the circuit board (not illustrated in the drawings) provided in the electrical apparatus or the like and exhibits a predetermined function in an electronic apparatus or the like.

As illustrated in FIG. 1B, the first element 20 has a first element board 21, 35 (a plurality of) first element signal transmitting/receiving terminals 24, and 7 (a plurality of) first element contactless signal transmitting/receiving coils 25 functioning as a plurality of first element contactless signal transmitting/receiving units. The 7 (the plurality of) first element contactless signal transmitting/receiving coils 25 are arranged in a line. The first element 20 is an element that includes one or more first element signal processing circuits (not illustrated in the drawings) serving to execute predetermined signal processing. The first element 20 may be a CPU, a memory, or the like.

The first element board 21 is a board that is formed of silicon. The first element board 21 has a first element-first principal surface 22 and a first element-second principal surface 23.

The first element-first principal surface 22 is a principal surface of a lower side of the first element board 21. The first element-second principal surface 23 is a surface opposite to the first element-first principal surface 22 and is a principal surface of an upper side of the first element board 21. A first element insulating layer 22A including a silicon oxide film in a single layer or a plurality of layers is provided on the first element-first principal surface 22 of the first element board 21. For this reason, the first element-first principal surface 22 becomes a surface that is formed of a silicon oxide film. In addition, the first element-second principal surface 23 is a surface to which silicon is exposed and is not provided with terminals or coils.

As illustrated in FIGS. 1(B) and 2(A), each of the first element signal transmitting/receiving terminals 24 is provided on the first element insulating layer 22A. Each of the first element signal transmitting/receiving terminals 24 is electrically connected to the first element signal processing circuit (not illustrated in the drawings) via internal wiring lines (not illustrated in the drawings) or via holes (not illustrated in the drawings) provided in the first element insulating layer 22A. In FIG. 2A, the first element insulating layer 22A is represented by providing oblique lines partially. As seen from FIG. 2A, the first element insulating layer 22A is provided on an entire surface of the first element board 21 at the side of the first element-first principal surface 22.

As illustrated in FIG. 2A, each of the first element contactless signal transmitting/receiving coils 25 is provided on the first element insulating layer 22A. Each of the first element contactless signal transmitting/receiving coils 25 is configured using a first element contactless signal transmitting/receiving coil wiring portion 25A, a first element contactless signal transmitting/receiving coil body portion 25B, and a via hole 25C for the first element contactless signal transmitting/receiving coil. The first element contactless signal transmitting/receiving coil body portion 25B is a coil that is configured using a wiring line. The first element contactless signal transmitting/receiving coil body portion 25B is connected to one end of the first element contactless signal transmitting/receiving coil wiring portion 25A and the via hole 25C for the first element contactless signal transmitting/receiving coil is connected to the other end of the first element contactless signal transmitting/receiving coil body portion 25B.

The via hole 25C for the first element contactless signal transmitting/receiving coil is electrically connected to the first element signal processing circuit (not illustrated in the drawings) via internal wiring lines (not illustrated in the drawings) or via holes (not illustrated in the drawings) provided in the first element insulating layer 22A. The first element contactless signal transmitting/receiving coil body portion 25B is electrically connected to the first element signal processing circuit (not illustrated in the drawings) via internal wiring lines (not illustrated in the drawings) provided in the first element contactless signal transmitting/receiving coil wiring portion 25A, the via hole 25C for the first element contactless signal transmitting/receiving coil, and the first element insulating layer 22A.

In the following description, a surface opposite to a region provided with the first element signal transmitting/receiving terminal 24 in the first element-first principal surface 22 in the first element-second principal surface 23 is called a first element-second principal surface terminal facing region 23A. In addition, a surface opposite to a region provided with the first element contactless signal transmitting/receiving coil body portion 25B in the first element-first principal surface 22 in the first element-second principal surface 23 is called a first element-second principal surface contactless signal transmitting/receiving unit facing region 23B.

As illustrated in FIG. 1B, the second element 30 has a second element board 31, 35 (a plurality of) second element signal transmitting/receiving terminals 34, and 7 (a plurality of) second element contactless signal transmitting/receiving coils 35 functioning as a plurality of second element contactless signal transmitting/receiving units. The 7 (the plurality of) second element contactless signal transmitting/receiving coils 35 are arranged in a line. The second element 30 is an element that includes one or more second element signal processing circuits (not illustrated in the drawings) serving to execute predetermined signal processing. The second element 30 may be a CPU, a memory, or the like. The second element 30 may be an element having the same function as the function of the first element 20 and may be an element having a different function.

The second element board 31 is a board that is formed of silicon. The second element board 31 has a second element-first principal surface 32 and a second element-second principal surface 33.

The second element-first principal surface 32 is a principal surface of a lower side of the second element board 31. The second element-second principal surface 33 is a surface opposite to the second element-first principal surface 32 and is a principal surface of an upper side of the second element board 31. A second element insulating layer 32A including a silicon oxide film of a single layer or a plurality of layers is provided on the second element-first principal surface 32 of the second element board 31. For this reason, the second element-first principal surface 32 becomes a surface that is formed of a silicon oxide film. In addition, the second element-second principal surface 33 is a surface to which silicon is exposed and is not provided with terminals or coils.

As illustrated in FIGS. 1(B) and 2(B), the plurality of second element signal transmitting/receiving terminals 34 are provided on the second element insulating layer 32A. The plurality of second element signal transmitting/receiving terminals 34 are electrically connected to the second element signal processing circuit (not illustrated in the drawings) via internal wiring lines (not illustrated in the drawings) or via holes (not illustrated in the drawings) provided in the second element insulating layer 32A. In FIG. 2B, the second element insulating layer 32A is represented by providing oblique lines partially. As seen from FIG. 2B, the second element insulating layer 32A is provided on an entire surface of the second element board 31 at the side of the second element-first principal surface 32.

As illustrated in FIG. 2B, each of the second element contactless signal transmitting/receiving coils 35 is provided on the second element insulating layer 32A. Each of the second element contactless signal transmitting/receiving coils 35 is configured using a second element contactless signal transmitting/receiving coil wiring portion 35A, a second element contactless signal transmitting/receiving coil body portion 35B, and a via hole 35C for the second element contactless signal transmitting/receiving coil. The second element contactless signal transmitting/receiving coil body portion 35B is a coil that is configured using a wiring line. The second element contactless signal transmitting/receiving coil body portion 35B is connected to one end of the second element contactless signal transmitting/receiving coil wiring portion 35A and the via hole 35C for the second element contactless signal transmitting/receiving coil is connected to the other end of the second element contactless signal transmitting/receiving coil body portion 35B.

The via hole 35C for the second element contactless signal transmitting/receiving coil is electrically connected to the second element signal processing circuit (not illustrated in the drawings) via internal wiring lines (not illustrated in the drawings) or via holes (not illustrated in the drawings) provided in the second element insulating layer 32A. The second element contactless signal transmitting/receiving coil body portion 35B is electrically connected to the second element signal processing circuit (not illustrated in the drawings) via internal wiring lines (not illustrated in the drawings) provided in the second element contactless signal transmitting/receiving coil wiring portion 35A, the via hole 35C for the second element contactless signal transmitting/receiving coil, and the second element insulating layer 32A.

In the following description, a surface opposite to a region provided with the second element signal transmitting/receiving terminal 34 in the second element-first principal surface 32 in the second element-second principal surface 33 is called a second element-second principal surface terminal facing region 33A. In addition, a surface opposite to a region provided with the second element contactless signal transmitting/receiving coil body portion 35B in the second element-first principal surface 32 in the second element-second principal surface 33 is called a second element-second principal surface contactless signal transmitting/receiving unit facing region 33B.

As illustrated in FIG. 1B, the interposer board 40 has an interposer board-first principal surface 41, an interposer board-second principal surface 42, a plurality of interposer board-first contactless signal transmitting/receiving coils 43 functioning as a plurality of interposer board-first contactless signal transmitting/receiving units, and a plurality of interposer board-second contactless signal transmitting/receiving coils 44 functioning as a plurality of interposer board-second contactless signal transmitting/receiving units. The interposer board 40 is a board that is formed of silicon. The interposer board-first principal surface 41 is a principal surface of a lower side of the interposer board 40. The interposer board-second principal surface 42 is a surface opposite to the interposer board-first principal surface 41 and is a principal surface of an upper side of the interposer board 40. An interposer board insulating layer 41A including a silicon oxide film in a single layer or a plurality of layers is provided on the interposer board-first principal surface 41 of the interposer board 40. For this reason, the interposer board-first principal surface 41 becomes a surface that is formed of a silicon oxide film. In addition, the interposer board-second principal surface 42 is a surface to which silicon is exposed and is not provided with terminals or coils.

As illustrated in FIGS. 1(B) and 2(C), each of the interposer board-first contactless signal transmitting/receiving coils 43 and each of the interposer board-second contactless signal transmitting/receiving coils 44 are provided on the interposer board insulating layer 41A. In FIG. 2C, the interposer board insulating layer 41A is represented by providing oblique lines partially. As seen from FIG. 2C, the interposer board insulating layer 41A is provided on an entire surface of the interposer board 40 at the side of the interposer board-first principal surface 41.

As illustrated in FIG. 2C, each of the interposer board-first contactless signal transmitting/receiving coils 43 and each of the interposer board-second contactless signal transmitting/receiving coils 44 are coils that are configured using wiring lines. The interposer board-first contactless signal transmitting/receiving coils 43 and the interposer board-second contactless signal transmitting/receiving coils 44 are electrically connected by interposer board wiring lines 45. That is, the interposer board-first contactless signal transmitting/receiving coil 43 is connected to one end of the interposer board wiring line 45 and the interposer board-second contactless signal transmitting/receiving coil 44 is connected to the other end of the interposer board wiring line 45. In addition, the interposer board wiring line 45 is provided on the interposer board insulating layer 41A.

As illustrated in FIGS. 1A and 1B, the first element 20 is disposed on the base board 10. The first element-first principal surface 22 faces the base board internal terminal surface 11. Each of the first element signal transmitting/receiving terminals 24 is electrically connected to each of the first element side base board internal terminals 13A via a first element conductive member 24A. The first element conductive member 24A is a conductive member such as a solder and a conductive adhesive. For this reason, it can be said that the first element signal transmitting/receiving terminal 24 and the first element side base board internal terminal 13A are in contact with each other and can transmit and receive a signal. The first element 20 is fixed on the base board 10 by the first element conductive member 24A. The first element 20 is connected facedown to the base board 10.

Each of the first element contactless signal transmitting/receiving coil body portions 25B is not electrically connected to the plurality of first element side base board internal terminals 13A via the conductive member.

The second element 30 is disposed on the base board 10. The second element-first principal surface 32 faces the base board internal terminal surface 11. Each of the second element signal transmitting/receiving terminals 34 is electrically connected to each of the second element side base board internal terminals 13B via a second element conductive member 34A. The second element conductive member 34A is a conductive member such as a solder and a conductive adhesive. For this reason, it can be said that the second element signal transmitting/receiving terminal 34 and the second element side base board internal terminal 13B are in contact with each other and can transmit and receive a signal. The second element 30 is fixed on the base board 10 by the second element conductive member 34A. The second element 30 is connected facedown to the base board 10. Each of the second element contactless signal transmitting/receiving coil body portions 35B is not electrically connected to the plurality of second element side base board internal terminals 13B via the conductive member.

As illustrated in FIGS. 1A and 1B, the interposer board 40 is disposed to extend on the first element 20 and the second element 30. The interposer board-first principal surface 41 faces the first element-second principal surface 23 and the second element-second principal surface 33. More specifically, the interposer board-first principal surface 41 faces the first element-second principal surface contactless signal transmitting/receiving unit facing region 23B and the second element-second principal surface contactless signal transmitting/receiving unit facing region 33B and faces a part of the first element-second principal surface terminal facing region 23A and a part of the second element-second principal surface terminal facing region 33A. In addition, the interposer board-first principal surface 41 is in contact with the first element-second principal surface 23 and the second element-second principal surface 33. The interposer board 40 is fixed on the first element 20 and the second element 30 by means of an adhesive.

The interposer board 40 covers the first element-second principal surface contactless signal transmitting/receiving unit facing region 23B and covers a part of the first element-second principal surface terminal facing region 23A. Likewise, the interposer board 40 covers the second element-second principal surface contactless signal transmitting/receiving unit facing region 33B and covers a part of the second element-second principal surface terminal facing region 33A.

Each of the interposer board-first contactless signal transmitting/receiving coils 43 faces each of the first element contactless signal transmitting/receiving coil body portions 25B. For this reason, the interposer board-first contactless signal transmitting/receiving coil 43 and the first element contactless signal transmitting/receiving coil body portion 25B can transmit and receive a signal contactlessly via the first element board 21. More specifically, the interposer board-first contactless signal transmitting/receiving coil 43 and the first element contactless signal transmitting/receiving coil body portion 25B can transmit and receive a signal contactlessly via the first element board 21, using inductive coupling generated between both the coils. In addition, the first element board 21 is formed thinly to transmit and receive a signal contactlessly between the interposer board-first contactless signal transmitting/receiving coil 43 and the first element contactless signal transmitting/receiving coil body portion 25B. For example, the thickness of the first element board 21 is 5 µm to 25 µm.

Each of the interposer board-second contactless signal transmitting/receiving coils 44 faces each of the second element contactless signal transmitting/receiving coil body portions 35B. For this reason, the interposer board-second contactless signal transmitting/receiving coil 44 and the second element contactless signal transmitting/receiving coil body portion 35B can transmit and receive a signal contactlessly via the second element board 31. More specifically, the interposer board-second contactless signal transmitting/receiving coil 44 and the second element contactless signal transmitting/receiving coil body portion 35B can transmit and receive a signal contactlessly via the second element board 31, using inductive coupling generated between both the coils. In addition, the second element board 31 is formed thinly to transmit and receive a signal contactlessly between the interposer board-second contactless signal transmitting/receiving coil 44 and the second element contactless signal transmitting/receiving coil body portion 35B. For example, the thickness of the second element board 31 is 5 µm to 25 µm.

As described above, the interposer board-first contactless signal transmitting/receiving coil 43 and the interposer board-second contactless signal transmitting/receiving coil 44 are electrically connected by the interposer board wiring line 45. Therefore, the first element 20 and the second element 30 can transmit and receive a signal via the interposer board 40.

For example, a signal output from the first element signal processing circuit (not illustrated in the drawings) is transmitted as a first element transmission signal S1 from the first element contactless signal transmitting/receiving coil body portion 25B. The first element transmission signal S1 is received by the interposer board-first contactless signal transmitting/receiving coil 43 and is transmitted from the interposer board-second contactless signal transmitting/receiving coil 44 via the interposer board wiring line 45. The first element transmission signal S1 transmitted from the interposer board-second contactless signal transmitting/receiving coil 44 is received by the second element contactless signal transmitting/receiving coil body portion 35B of the second element 30. Likewise, a second element transmission signal S2 transmitted from the second element contactless signal transmitting/receiving coil body portion 35B is received by the first element contactless signal transmitting/receiving coil body portion 25B of the first element 20 via the interposer board-second contactless signal transmitting/receiving coil 44, the interposer board wiring line 45, and the interposer board-first contactless signal transmitting/receiving coil 43.

According to the semiconductor device 1 according to the first embodiment having the above configuration, the following effects are achieved. The semiconductor device includes the base board 10 that has the base board internal terminal surface 11 provided with the plurality of base board internal terminals 13; the first element 20 that has the first element board 21 having the first element-first principal surface 22 and the first element-second principal surface 23 that is the surface opposite to the first element-first principal surface 22, the first element signal transmitting/receiving terminals 24 provided on the first element-first principal surface 22, and the first element contactless signal transmitting/receiving coils 25 provided on the first element-first principal surface 22; the second element 30 that has the second element board 31 having the second element-first principal surface 32 and the second element-second principal surface 33 that is the surface opposite to the second element-first principal surface 32, the second element signal transmitting/receiving terminals 34 provided on the second element-first principal surface 32, and the second element contactless signal transmitting/receiving coils 35 provided on the second element-first principal surface 32; and the interposer board 40 that has the interposer board-first principal surface 41, the interposer board-first contactless signal transmitting/receiving coils 43 provided on the interposer board-first principal surface 41, and the interposer board-second contactless signal transmitting/receiving coils 44 provided on the interposer board-first principal surface 41 and electrically connected to the interposer board-first contactless signal transmitting/receiving coils 43. In addition, the first element 20 is disposed on the base board 10 such that the first element-first principal surface 22 faces the base board internal terminal surface 11 and the first element signal transmitting/receiving terminal 24 and one of the plurality of base board internal terminals 13 are in contact with each other and are capable of transmitting and receiving a signal. The second element 30 is disposed on the base board 10 such that the second element-first principal surface 32 faces the base board internal terminal surface 11 and the second element signal transmitting/receiving terminal 34 and one of the plurality of base board internal terminals 13 are in contact with each other and are capable of transmitting and receiving a signal. The interposer board 40 is disposed to extend on the first element 20 and the second element 30 such that the interposer board-first principal surface 41 faces the first element-second principal surface 23 and the second element-second principal surface 33, the interposer board-first contactless signal transmitting/receiving coil 43 is capable of contactlessly transmitting and receiving a signal to and from the first element contactless signal transmitting/receiving coil 25 via the first element board 21, and the interposer board-second contactless signal transmitting/receiving coil 44 is capable of contactlessly transmitting and receiving a signal to and from the second element contactless signal transmitting/receiving coil 35 via the second element board 31.

For this reason, the shape of the interposer board 40 is not restricted by the shapes of the first element-second principal surface contactless signal transmitting/receiving unit facing region 23B and the second element-second principal surface contactless signal transmitting/receiving unit facing region 33B. Therefore, in the semiconductor device 1 according to the first embodiment, the region provided with the first element contactless signal transmitting/receiving coil 25 in the first element board 21 and the region provided with the second element contactless signal transmitting/receiving coil 35 can be reduced in size. As a result, the semiconductor device 1 according to the first embodiment has a configuration in which miniaturization is enabled.

As is apparent from the configuration of the semiconductor device 1, when the semiconductor device 1 is manufactured, the interposer board 40 can be disposed finally. In addition, in the semiconductor device 1, an aspect ratio of the interposer board 40 is suppressed from increasing. For example, if the interposer board 40 is disposed on only the first element-second principal surface contactless signal transmitting/receiving unit facing region 23B and the second element-second principal surface contactless signal transmitting/receiving unit facing region 33B, the interposer board 40 is likely to become a board in which an aspect ratio is large (for example, 10 or more). However, the interposer board 40 is disposed on the first element-second principal surface terminal facing region 23A and the second element-second principal surface terminal facing region 33A as well as the first element-second principal surface contactless signal transmitting/receiving unit facing region 23B and the second element-second principal surface contactless signal transmitting/receiving unit facing region 33B. For this reason, the aspect ratio of the interposer board 40 is suppressed from increasing. In addition, the interposer board 40 is provided with only the coils and the wiring lines, and an active element to which it is necessary to supply a power supply voltage is not disposed on the interposer board 40. Therefore, in the interposer board 40, it is unnecessary to supply the power supply voltage and it is unnecessary to provide wiring lines or terminals to supply the power supply voltage. For this reason, the semiconductor device 1 has a configuration in which manufacturing is easy.

In addition, in the semiconductor device 1 according to the first embodiment, the first element 20 and the second element 30 can transmit and receive a signal contactlessly via the interposer board 40. For this reason, when the first element 20 and the second element 30 are connected, impedance matching is unnecessary (or precision of the impedance matching is mitigated as compared with a semiconductor device in which a first element and a second element are in contact with each other and transmit and receive a signal).

In addition, a part of the first element-second principal surface 23 of the first element board 21 is not covered with the interposer board 40. Therefore, heat generated by the first element 20 is radiated from the first element-second principal surface 23. In addition, a part of the second element-second principal surface 33 of the second element board 31 is not covered with the interposer board 40. Therefore, heat generated by the second element 30 is radiated from the second element-second principal surface 33.

In addition, the first element-second principal surface 23 has the first element-second principal surface terminal facing region 23A that is the surface opposite to the region provided with the first element signal transmitting/receiving terminal 24 in the first element-first principal surface 22 and the first element-second principal surface contactless signal transmitting/receiving unit facing region 23B that is the surface opposite to the region provided with the first element contactless signal transmitting/receiving coil 25 in the first element-first principal surface 22. The second element-second principal surface 33 has the second element-second principal surface terminal facing region 33A that is the surface opposite to the region provided with the second element signal transmitting/receiving terminal 34 in the second element-first principal surface 32 and the second element-second principal surface contactless signal transmitting/receiving unit facing region 33B that is the surface opposite to the region provided with the second element contactless signal transmitting/receiving coil 35 in the second element-first principal surface 32. The interposer board-first principal surface 41 of the interposer board 40 faces the first element-second principal surface contactless signal transmitting/receiving unit facing region 23B and the second element-second principal surface contactless signal transmitting/receiving unit facing region 33B and faces at least one of the part of the first element-second principal surface terminal facing region 23A and the part of the second element-second principal surface terminal facing region 33A.

For this reason, the semiconductor device 1 according to the first embodiment has a configuration in which miniaturization is enabled and manufacturing is easy.

[Second Embodiment]

Figure 3A:
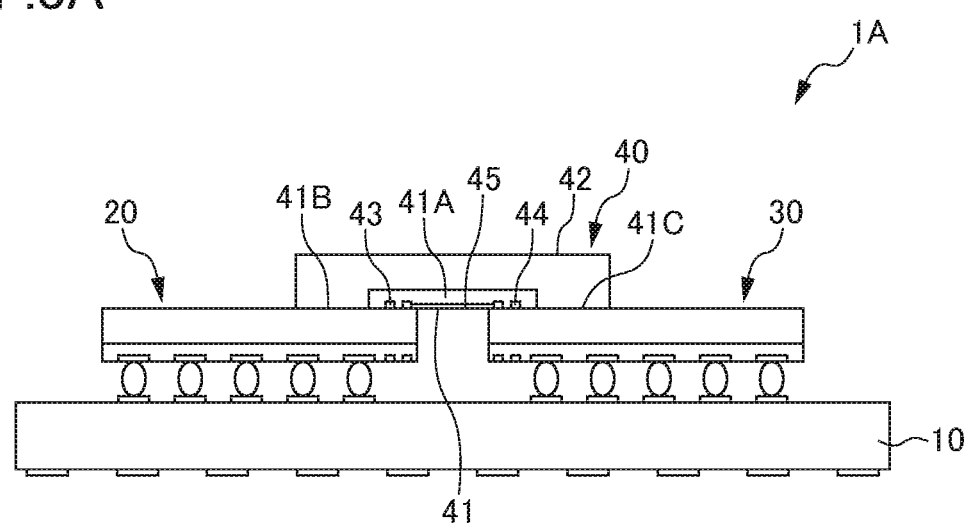
Figure 3B:
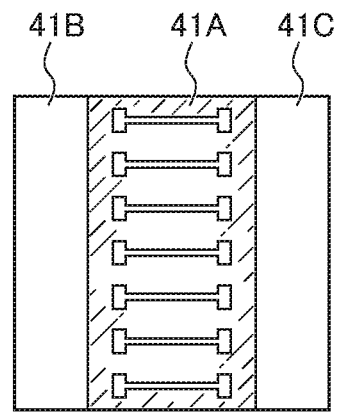

Next, a second embodiment of the present invention will be described with reference to FIGS. 3A and 3B. FIGS. 3A and 3B are diagrams illustrating a semiconductor device 1A according to the second embodiment of the present invention, FIG. 3A is a cross-sectional view of the semiconductor device 1A according to the second embodiment, and FIG. 3B is a plan view when an interposer board 40 is viewed from an interposer board-first principal surface.

For the second embodiment, the points different to the first embodiment are mainly described and a detailed description of the configuration that is the same as the configuration of the first embodiment is omitted. For points not described in particular, the description of the first embodiment is appropriately applied.

As illustrated in FIGS. 3A and 3B, the semiconductor device 1A according to the second embodiment includes a base board 10, a first element 20, a second element 30, and an interposer board 40 formed of a material including silicon as a main component. In the semiconductor device 1A according to the second embodiment, a configuration of the interposer board 40 is different from the configuration of the interposer board 40 in the semiconductor device 1 according to the first embodiment.

As illustrated in FIGS. 3(A) and 3(B), on an interposer board-first principal surface 41 of the interposer board 40 in the semiconductor device 1A according to the second embodiment, an interposer board insulating layer 41A including a silicon oxide film in a single layer or a plurality of layers is provided only in the vicinity of the center of the interposer board 40 at the side of the interposer board-first principal surface 41, different from the interposer board 40 in the semiconductor device 1 according to the first embodiment. A portion not provided with the interposer board insulating layer 41A at the side of the interposer board-first principal surface 41 becomes a portion to which silicon is exposed. In the portion to which silicon is exposed, a portion of the side of the first element 20 is a first element side exposure portion 41B and a portion of the side of the second element 30 is a second element side exposure portion 41C. In FIG. 3B, the interposer board insulating layer 41A is represented by providing oblique lines partially. The interposer board-first principal surface 41 of the interposer board 40 in the semiconductor device 1A according to the second embodiment is configured using a surface formed of a silicon oxide film and a surface to which silicon is exposed.

The first element side exposure portion 41B is in contact with a first element-second principal surface terminal facing region 23A and the second element side exposure portion 41C is in contact with a second element-second principal surface terminal facing region 33A.

The thermal conductivity (about 160 W/m·K) of silicon is larger than the thermal conductivity (about 1.3 W/m·K) of the silicon oxide film. For this reason, the first element side exposure portion 41B in the interposer board 40 functions as a heat radiation unit that is in contact with the first element-second principal surface 23 and radiates heat generated by the first element 20. Likewise, the second element side exposure portion 41C in the interposer board 40 functions as a heat radiation unit that is in contact with the second element-second principal surface 33 and radiates heat generated by the second element 30.

According to the semiconductor device 1A according to the second embodiment having the above configuration, the following effects are achieved. In the semiconductor device 1A according to the second embodiment, a first element board 21, a second element board 31, and the interposer board 40 are formed of silicon, the interposer board-first principal surface 41 of the interposer board 40 has an exposure portion to which silicon is exposed, and the exposure portion is in contact with a part of the first element-second principal surface terminal facing region 23A and a part of the second element-second principal surface terminal facing region 33A. For this reason, even if the size of the interposer board 40 increases, the heat of the first element 20 or the heat of the second element 30 is radiated because there are the first element side exposure portion 41B and the second element side exposure portion 41C. Therefore, the shape of the interposer board 40 is not restricted by the shapes of a first element-second principal surface contactless signal transmitting/receiving unit facing region 23B and a second element-second principal surface contactless signal transmitting/receiving unit facing region 33B and is hardly restricted by the heat generated by the first element 20 or the second element 30.

[Third Embodiment]

Figure 4A:
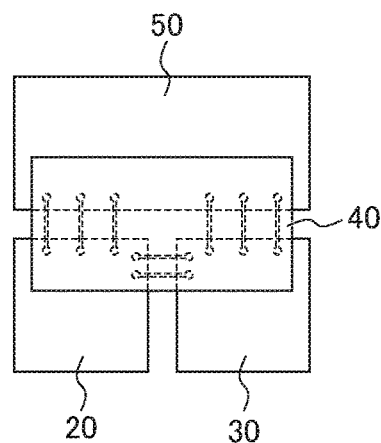
Figure 4B:
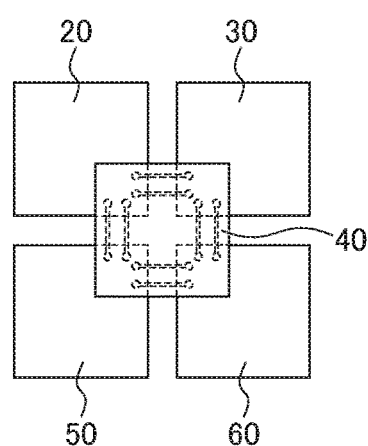
Figure 4C:
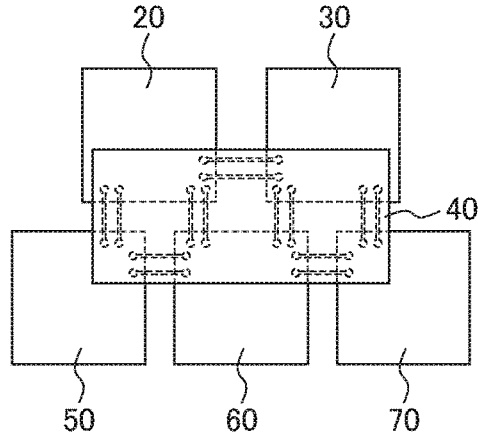

Next, a third embodiment of the present invention will be described with reference to FIGS. 4A to 4C. FIGS. 4A to 4C are diagrams illustrating a variation of an arrangement of an interposer board, FIG. 4A is a diagram illustrating the case in which the interposer board is applied to three elements, FIG. 4B is a diagram illustrating the case in which the interposer board is applied to four elements, and FIG. 4C is a diagram illustrating the case in which the interposer board is applied to five elements.

For the third embodiment, the points different to the first embodiment are mainly described and a detailed description of the configuration that is the same as the configuration of the first embodiment is omitted. For points not described in particular, the description of the first embodiment is appropriately applied.

As illustrated in FIG. 4A, an interposer board 40 can be disposed to extend on a first element 20, a second element 30, and a third element 50. The first element 20, the second element 30, and the third element 50 can mutually transmit and receive a signal via the interposer board 40.

In FIG. 4A, for convenience, a lower left element becomes the first element 20, a lower right element becomes the second element 30, and an upper element becomes the third element 50. However, the first element 20, the second element 30, and the third element 50 are mutually interchangeable. For example, the upper element may be the first element 20 (or the second element 30) and the lower left element (or the lower right element) may be the second element 30 (or the first element 20). For example, the size of the first element 20 and the size of the second element 30 may be different from each other.

As illustrated in FIG. 4B, the interposer board 40 can be disposed to extend on the first element 20, the second element 30, the third element 50, and a fourth element 60. The first element 20, the second element 30, the third element 50, and the fourth element 60 can mutually transmit and receive a signal via the interposer board 40.

In FIG. 4B, the first element 20 may be any one of an upper left element, a lower left element, an upper right element, and a lower right element. For example, the upper left element may be the first element 20 (or the second element 30) and the lower right element may be the second element 30 (or the first element 20). For example, the first element 20 and the second element 30 may be disposed not to have facing sides.

As illustrated in FIG. 4C, the interposer board 40 can be disposed to extend on the first element 20, the second element 30, the third element 50, the fourth element 60, and a fifth element 70. The first element 20, the second element 30, the third element 50, the fourth element 60, and the fifth element 70 can mutually transmit and receive a signal via the interposer board 40.

In FIG. 4C, the first element 20 may be any one of an upper left element, an upper right element, a lower left element, a lower center element, and a lower right element. In addition, the second element 30 may be any one of the upper left element, the upper right element, the lower left element, the lower center element, and the lower right element. For example, the upper left element may be the first element 20 (or the second element 30) and the lower right element may be the second element 30 (or the first element 20). For example, the first element 20 and the second element 30 may be disposed such that the first element 20 and the second element 30 do not have facing sides and another element exists between the first element 20 and the second element 30.

The first to third embodiments of the present invention have been described. However, the present invention is not limited to the embodiments and various modifications can be made in a technical range described in claims.

In addition, in the first to third embodiments, the inductive coupling between the coils is used when the contactless signal is transmitted and received. However, the present invention is not limited thereto. The transmission and reception of the contactless signal may be transmission and reception of the contactless signal using magnetic resonance between the coils and may be transmission and reception of the contactless signal using an optical signal or an acoustic signal.

In addition, in the first to third embodiments, the interposer board 40 is formed of silicon. However, the present invention is not limited thereto. The interposer board 40 may be formed of a semiconductor material other than silicon. The semiconductor material means a material that has a property of a semiconductor and a material that has the property of the semiconductor by being doped with impurities. In addition, the interposer board 40 may be a board other than the board formed of the semiconductor material, for example, a board formed of glass or a resin material. In addition, the interposer board 40 may be a printed wiring board.

In addition, in the first to third embodiments, the base board 10 is the printed wiring board. However, the present invention is not limited thereto. The base board 10 may be a board that is formed of a semiconductor material such as silicon. In addition, the base board 10 may be a semiconductor element having a signal processing function.

In addition, in the first to third embodiments, the interposer board 40 is fixed on the first element 20 and the second element 30 by means of the adhesive. However, the present invention is not limited thereto. The interposer board 40 may be fixed on the first element 20 and the second element 30 using the adhesive or a fixing member other than the adhesive. In addition, the interposer board 40 may be fixed on the first element 20 and the second element 30 using direct joining technology such as normal temperature joining.

In addition, in the first and third embodiments, the interposer board-first principal surface 41 is in contact with the part of the first element-second principal surface 23 and the part of the second element-second principal surface 33. However, the present invention is not limited thereto. The interposer board-first principal surface 41 may face the first element-second principal surface 23 and the second element-second principal surface 33. For example, the interposer board 40 may be disposed apart from the first element-second principal surface 23 and the second element-second principal surface 33, using a spacer or the like.

In addition, in the first to third embodiments, the interposer board-first principal surface 41 faces the part of the first element-second principal surface terminal facing region 23A and the part of the second element-second principal surface terminal facing region 33A. However, the present invention is not limited thereto. The interposer board-first principal surface 41 may face at least one of the part of the first element-second principal surface terminal facing region 23A and the part of the second element-second principal surface terminal facing region 33A.

In addition, in the second embodiment, the exposure portion of the interposer board-first principal surface 41 is in contact with the part of the first element-second principal surface terminal facing region 23A and the part of the second element-second principal surface terminal facing region 33A. However, the present invention is not limited thereto. The exposure portion of the interposer board-first principal surface 41 may be in contact with at least one of the part of the first element-second principal surface terminal facing region 23A and the part of the second element-second principal surface terminal facing region 33A. For example, in the interposer board-first principal surface 41, only one of the first element side exposure portion 41B and the second element side exposure portion 41C may exist.

In addition, in the first to third embodiments, the interposer board-first principal surface 41 may be disposed not to face a region where the most heat is generated in the first element-second principal surface terminal facing region 23A and a region where the most heat is generated in the second element-second principal surface terminal facing region 33A. This is because the heat is easily radiated when the region where the most heat is generated in the first element-second principal surface terminal facing region 23A and the region where the most heat is generated in the second element-second principal surface terminal facing region 33A are not covered by the interposer board 40.

In addition, in the first to third embodiments, the first element contactless signal transmitting/receiving coil 25 is provided on the first element insulating layer 22A. However, the present invention is not limited thereto. The first element contactless signal transmitting/receiving coil 25 may be provided in the first element insulating layer 22A. The first element contactless signal transmitting/receiving coil 25 may be exposed to the first element insulating layer 22A and may not be exposed to the first element insulating layer 22A. The first element contactless signal transmitting/receiving coil 25 may be provided on the first element-first principal surface 22. The side of the first element-first principal surface 22 means a portion (including a surface of the first element-first principal surface 22) closer to the first element-first principal surface 22 than the first element-second principal surface 23 in the thickness direction of the first element board 21.

The second element contactless signal transmitting/receiving coil 35 is provided on the second element insulating layer 32A. However, the present invention is not limited thereto. The second element contactless signal transmitting/receiving coil 35 may be provided in the second element insulating layer 32A. That is, the second element contactless signal transmitting/receiving coil 35 may be exposed to the second element insulating layer 32A and may not be exposed to the second element insulating layer 32A. The second element contactless signal transmitting/receiving coil 35 may be provided on the second element-first principal surface 32. The side of the second element-first principal surface 32 means a portion (including a surface of the second element-first principal surface 32) closer to the second element-first principal surface 32 than the second element-second principal surface 33 in the thickness direction of the second element board 31.

The interposer board-first contactless signal transmitting/receiving coil 43, the interposer board-second contactless signal transmitting/receiving coil 44, and the interposer board wiring line 45 are provided on the interposer board insulating layer 41A. However, the present invention is not limited thereto. The interposer board-first contactless signal transmitting/receiving coil 43, the interposer board-second contactless signal transmitting/receiving coil 44, and the interposer board wiring line 45 may be provided inside. That is, the interposer board-first contactless signal transmitting/receiving coil 43, the interposer board-second contactless signal transmitting/receiving coil 44, and the interposer board wiring line 45 may be exposed to the interposer board insulating layer 41A and may not be exposed to the interposer board insulating layer 41A. In addition, the interposer board-first contactless signal transmitting/receiving coil 43, the interposer board-second contactless signal transmitting/receiving coil 44, and the interposer board wiring line 45 may be provided on the interposer board-first principal surface 41. The side of the interposer board-first principal surface 41 means a portion (including a surface of the interposer board-first principal surface 41) closer to the interposer board-first principal surface 41 than the interposer board-second principal surface 42 in the thickness direction of the interposer board 40.

In addition, in the first to third embodiments, the number of first element signal transmitting/receiving terminals 24 in the first element 20 is 35 and the number of second element signal transmitting/receiving terminals 34 in the second element 30 is 35. However, the present invention is not limited thereto. The number of each of the first element signal transmitting/receiving terminals 24 and the second element signal transmitting/receiving terminals 34 may be any number. In addition, the number of first element contactless signal transmitting/receiving coils 25 in the first element 20 is 7 and the number of second element contactless signal transmitting/receiving coils 35 in the second element 30 is 7. However, the present invention is not limited thereto. The number of each of the first element contactless signal transmitting/receiving coils 25 and the second element contactless signal transmitting/receiving coils 35 may be any number. In FIGS. 2A to 2C, the first element contactless signal transmitting/receiving coils 25 and the second element contactless signal transmitting/receiving coils 35 are provided to be arranged in a line. However, the first element contactless signal transmitting/receiving coils 25 and the second element contactless signal transmitting/receiving coils 35 may be provided to be arranged in two lines or more.

In addition, in the first and second embodiments, the first element insulating layer 22A, the second element insulating layer 32A, and the interposer board insulating layer 41A are formed of the silicon oxide film. However, the first element insulating layer 22A, the second element insulating layer 32A, and the interposer board insulating layer 41A may be formed of an insulating member such as a silicon nitride film.

EXPLANATION OF REFERENCE NUMERALS 1, 1A: semiconductor device
10: base board
11: base board internal terminal surface (base board terminal surface)
12: base board external terminal surface
13: base board internal terminal (base board terminal)
13A: first element side base board internal terminal
13B: second element side base board internal terminal
14: base board external terminal
20: first element
21: first element board
22: first element-first principal surface
22A: first element insulating layer
23: first element-second principal surface
23A: first element-second principal surface terminal facing region
23B: first element-second principal surface contactless signal transmitting/receiving unit facing region
24: first element signal transmitting/receiving terminal
24A: first element conductive member
25: first element contactless signal transmitting/receiving coil (first element contactless signal transmitting/receiving unit)
25A: first element contactless signal transmitting/receiving coil wiring portion
25B: first element contactless signal transmitting/receiving coil body portion
25C: via hole for first element contactless signal transmitting/receiving coil
30: second element
31: second element board
32: second element-first principal surface
32A: second element insulating layer
33: second element-second principal surface
33A: second element-second principal surface terminal facing region
33B: second element-second principal surface contactless signal transmitting/receiving unit facing region
34: second element signal transmitting/receiving terminal
34A: second element conductive member
35: second element contactless signal transmitting/receiving coil (second element contactless signal transmitting/receiving unit)
40: interposer board
41: interposer board-first principal surface
41A: interposer board insulating layer
41B: first element side exposure portion
41C: second element side exposure portion
42: interposer board-second principal surface
43: interposer board-first contactless signal transmitting/receiving coil (interposer board-first contactless signal transmitting/receiving unit)
44: interposer board-second contactless signal transmitting/receiving coil (interposer board-second contactless signal transmitting/receiving unit)
45: interposer board wiring line

The invention claimed is:

1. A semiconductor device comprising:
a base board that has a base board terminal surface provided with a plurality of base board terminals;
a first element that has a first element board having a first element-first principal surface and a first element-second principal surface that is a surface opposite to the first element-first principal surface, a first element signal transmitting/receiving terminal provided on the first element-first principal surface of the first element board, and a first element contactless signal transmitting/receiving unit provided on the first element-first principal surface of the first element board;
a second element that has a second element board having a second element-first principal surface and a second element-second principal surface that is a surface opposite to the second element-first principal surface, a second element signal transmitting/receiving terminal provided on the second element-first principal surface of the second element board, and a second element contactless signal transmitting/receiving unit provided on the second element-first principal surface of the second element board; and an interposer board with an interposer board-first principal surface that has an interposer board-first contactless signal transmitting/receiving unit provided on the interposer board-first principal surface and an interposer board-second contactless signal transmitting/receiving unit provided on the interposer board-first principal surface and electrically connected to the interposer board-first contactless signal transmitting/receiving unit, wherein the first element is disposed on the base board such that the first element-first principal surface faces the base board terminal surface and the first element signal transmitting/receiving terminal and one of the plurality of base board terminals are in contact with each other and are capable of transmitting and receiving a signal, the second element is disposed on the base board such that the second element-first principal surface faces the base board terminal surface, and the second element signal transmitting/receiving terminal and one of the plurality of base board terminals are in contact with each other and are capable of transmitting and receiving a signal, the interposer board is disposed to extend on the first element and the second element such that the interposer board-first principal surface faces the first element-second principal surface and the second element-second principal surface, the interposer board-first contactless signal transmitting/receiving unit is capable of contactlessly transmitting and receiving a signal to and from the first element contactless signal transmitting/receiving unit via the first element board, and the interposer board-second contactless signal transmitting/receiving unit is capable of contactlessly transmitting and receiving a signal to and from the second element contactless signal transmitting/receiving unit via the second element board, the first element-second principal surface has a first element-second principal surface terminal facing region that is a surface opposite to a region provided with the first element signal transmitting/receiving terminal in the first element-first principal surface and a first element-second principal surface contactless signal transmitting/receiving unit facing region that is a surface opposite to a region provided with the first element contactless signal transmitting/receiving unit in the first element-first principal surface, the second element-second principal surface has a second element-second principal surface terminal facing region that is a surface opposite to a region provided with the second element signal transmitting/receiving terminal in the second element-first principal surface and a second element-second principal surface contactless signal transmitting/receiving unit facing region to be a surface opposite to a region provided with the second element contactless signal transmitting/receiving unit in the second element-first principal surface, the interposer board-first principal surface of the interposer board faces the first element-second principal surface contactless signal transmitting/receiving unit facing region and the second element-second principal surface contactless signal transmitting/receiving unit facing region and faces at least one of a part of the first element-second principal surface terminal facing region and a part of the second element-second principal surface terminal facing region, and the first element board, the second element board, and the interposer board are formed of a semiconductor material, the interposer board-first principal surface of the interposer board has an exposure portion in which the semiconductor material is exposed, and the exposure portion is in contact with at least one of the part of the first element-second principal surface terminal facing region and the part of the second element-second principal surface terminal facing region.

2. The semiconductor device according to claim 1, wherein
the first element contactless signal transmitting/receiving unit, the second element contactless signal transmitting/receiving unit, the interposer board-first contactless signal transmitting/receiving unit, and the interposer board-second contactless signal transmitting/receiving unit are coils that are formed of wiring lines.

* * * * *